United States Patent
Lee et al.

(10) Patent No.: US 6,787,739 B2
(45) Date of Patent: Sep. 7, 2004

(54) APPARATUS FOR PROCESSING A SUBSTRATE INCLUDING A HEATING APPARATUS

(75) Inventors: Tae-Won Lee, Incheon-si (KR); Do-In Bae, Gyeongsangnam-do (KR); Sang-Yeoul Lee, Gyeonggi-do (KR)

(73) Assignee: Samsung Electronics Co., LTD, Suwon (KR)

( * ) Notice: Subject to any disclaimer, the term of this patent is extended or adjusted under 35 U.S.C. 154(b) by 47 days.

(21) Appl. No.: 10/264,482

(22) Filed: Oct. 4, 2002

(65) Prior Publication Data

US 2003/0066826 A1 Apr. 10, 2003

(30) Foreign Application Priority Data

Oct. 5, 2001 (KR) .......................................... 2001-61512

(51) Int. Cl.⁷ ................................................. H05B 3/68
(52) U.S. Cl. ................................. 219/444.1; 219/465.1; 219/546
(58) Field of Search ........................... 219/443.1, 444.1, 219/445.1, 446.1, 445.11, 445.12, 465.1, 468.2, 544, 546, 547, 548; 118/724, 725

(56) References Cited

U.S. PATENT DOCUMENTS

| | | | | |
|---|---|---|---|---|
| 3,845,273 A | * | 10/1974 | Hurko .................... 219/467.1 |
| 4,394,564 A | * | 7/1983 | Dills ...................... 219/448.17 |
| 4,697,068 A | * | 9/1987 | Schreder ................. 219/448.19 |
| 5,294,778 A | | 3/1994 | Carman et al. |
| 5,635,093 A | * | 6/1997 | Arena et al. ............. 219/444.1 |
| 6,147,334 A | * | 11/2000 | Hannigan ................... 219/544 |
| 6,180,931 B1 | * | 1/2001 | Futakuchiya et al. ....... 219/544 |
| 6,207,932 B1 | | 3/2001 | Yoo |
| 6,299,691 B1 | * | 10/2001 | Oda et al. .................... 118/715 |
| 6,403,933 B1 | * | 6/2002 | Strodtbeck et al. ......... 219/502 |

* cited by examiner

Primary Examiner—Sang Y. Paik
(74) Attorney, Agent, or Firm—Marger Johnson & McCollom, P.C.

(57) ABSTRACT

An apparatus for heating a substrate of a semiconductor device includes a hot plate, on which a semiconductor substrate is placed, and a heater for heating the hot plate. The hot plate is preferably a composite plate including a plurality of plates having different thermal conductivities from each other. For example, a first plate adjacent to the heater can be made of aluminum, which has a relatively high thermal conductivity. A second plate, laminated on top of the first plate, can be made of titanium or stainless steel, which both have a thermal conductivity lower than aluminum. A composite hot plate as disclosed herein is better able to maintain a constant temperature and a uniform temperature distribution in order to more uniformly heat a substrate and to reduce an amount of energy required for the heating process. In addition, the reliability and productivity of the semiconductor device manufactured by the apparatus can be improved.

19 Claims, 8 Drawing Sheets

APPARATUS FOR PROCESSING A SUBSTRATE INCLUDING A HEATING APPARATUS

This application claims priority from Korean Application No. 2001-61512, filed Oct. 5, 2001, the contents of which are incorporated herein by reference in their entirety.

BACKGROUND OF THE INVENTION

1. Field of the Invention

The present invention relates to an apparatus for heating a substrate during a semiconductor device fabricating process. The invention also relates to a substrate processing apparatus having a heating apparatus. More particularly, the invention relates to a hot plate having a uniform temperature distribution and a semiconductor wafer processing apparatus that includes the hot plate.

2. Description of the Related Art

Recently, as computers have become more popular, semiconductor devices have become more developed as an information media. As part of this trend, semiconductor devices are required to have higher-speed operation and larger storage capacities. For this reason, semiconductor device manufacturing techniques must be developed to improve the integration density, reliability, and response speed of the semiconductor device.

Conventionally, semiconductor devices are manufactured by successively performing a plurality of unit processes such as a deposition process, a photolithography process, an etching process, an ion implanting process, a polishing process, a cleaning process, etc. A process for forming a layer on a substrate, a process for baking a photoresist composition on the substrate, and a process for removing a photoresist pattern used as a mask on the substrate are each performed by heating the substrate to a high temperature.

Precise control of the temperature of an apparatus for heating the substrate is required in current semiconductor fabrication processes that require a design rule of less than 0.15 mm. If the temperature of the substrate is not uniform, a pattern cannot be uniformly formed on the substrate. A non-uniform pattern lowers the reliability of the semiconductor device.

FIG. 1 is a schematic cross-sectional view of a conventional apparatus for heating a substrate. Referring to FIG. 1, a process for manufacturing the substrate is carried out in a chamber 100. A heater 102, for heating the substrate, is connected to a lower portion of the chamber 100. The heater 102 includes a lamp 104 and a quartz plate 106 installed over the lamp 104. A light radiated from the lamp 104 heats a hot plate 108, on which the substrate is placed, through the quartz plate 106. The hot plate 108 is made of aluminum because it has a relatively high thermal conductivity.

A temperature sensor 110 is installed on a peripheral portion of the hot plate 108. A controller 112 is connected to the temperature sensor 110. The controller 112 generates a control signal to control a temperature of the hot plate 108 based on a signal from the temperature sensor 110. A power supply 114 provides the lamp 104 with electric power by receiving the control signal.

Unfortunately, a temperature differential arises in the material of the conventional hot plate 108 during the process for manufacturing the substrate. The temperature differential results in process defects. A heater that uses a hot wire installed on a lower surface of a hot plate to heat a substrate encounters similar problems due to a temperature differential across the hot plate. If the hot plate 108 temperature is non-uniform, the thickness of a layer formed on the substrate during a deposition process will not be uniform. The thickness of a pattern formed on the substrate in an etching process is also not uniform if the hot plate 108 temperature is non-uniform. Additionally, the temperature differential results in the thickness of a photoresist layer in a baking process being non-uniform. Further, the photoresist layer will not be completely removed in an ashing process when the temperature is non-uniform.

The problems caused by the temperature differential become more severe as the diameter of the substrate becomes larger. Accordingly, the industry has made several attempts to modify the heater structure as well as the material used in order to solve the temperature differential problem. For example, U.S. Pat. No. 5,294,778 issued to Carman, et al. discloses a heating system that includes a spiral shaped main resistance heater and two single turn edge loss graphite resistance heaters. One of the edge loss graphite resistance heaters is located within the inner diameter of the main spiral shaped resistance heater and the other is located along a periphery of the outer diameter of the main resistance heater.

U.S. Pat. No. 6,207,932 issued to Yoo discloses a body member having a wafer support. A gas line provides a processing gas to the wafer support. A heater block provides the heated elements with electric power and temperature control. In Yoo, however, the heater maintains a constant hot plate temperature to reduce the processing time of the unit processes. Accordingly, the thermal efficiency of the heater is decreased and energy loss of the heater is increased.

SUMMARY OF THE INVENTION

Various principles of the present invention provide a solution to the foregoing problem. According to these principles, a substrate heating apparatus includes a hot plate that maintains its heat as well as a uniform temperature distribution.

More particularly, according to one aspect of the present invention, an apparatus for heating the substrate comprises a heater for heating the substrate and a hot plate, on which the substrate is placed. The hot plate is preferably a composite plate including a plurality of plates each having a different thermal conductivity from each other. The substrate is then heated by heat provided from the heater.

In one embodiment of the present invention, the hot plate includes a first plate having a first thermal conductivity. A second plate having a second thermal conductivity is laminated on an upper surface of the first plate. The first plate can, for example, be made of aluminum and the second plate can be made of stainless steel or titanium.

In another embodiment, the hot plate includes a first plate formed of a material such as aluminum having a first thermal conductivity. A second plate is laminated to an upper surface of the first plate and a third plate is laminated to a lower surface of the first plate. In this embodiment, the second plate and the third plate are preferably formed of a material such as stainless steel or titanium having a second thermal conductivity.

In a still further embodiment, the hot plate includes a first plate made of a material such as copper having a first thermal conductivity. A second plate is laminated to an upper surface of the first plate. A third plate is laminated to an upper surface of the second plate. In this embodiment, the second plate is preferably made of a material such as aluminum having a second thermal conductivity. The third plate is preferably made of a material such as stainless steel or titanium having a third thermal conductivity.

According to yet another aspect of the present invention, the heater can include a hot wire therein or a lamp radiating a light. The hot wire and lamp generate heat by receiving electric power. The apparatus for heating the substrate may further include a sensor installed at an edge portion of an upper surface of the hot plate for sensing a temperature of the hot plate. A controller can be connected to the sensor to control the temperature of the hot plate using a signal from the sensor.

A composite plate constructed having a plurality of plates with different thermal conductivities provides a uniform temperature distribution when heating a substrate. Accordingly, using the above-described embodiments, the substrate placed on the hot plate can be uniformly heated. Furthermore, the energy required to keep the hot plate at a constant temperature is reduced. Accordingly, the composite plate is able to heat the substrate at a constant temperature.

According another aspect of the present invention, an apparatus for manufacturing a substrate comprises a chamber for performing the substrate manufacturing process. A gas supply provides an inside of the chamber with gas for the process. Means for heating the substrate comprises a heater arranged in the chamber to provide heat for heating the substrate. A hot plate, on which the substrate is placed, includes a composite plate formed from a plurality of plates having different thermal conductivities from each other. The substrate is heated by heat supplied from the heater. A process for removing a photoresist layer formed on the substrate and a process for forming a layer on the substrate using plasma can also be performed in the chamber.

According to a still further aspect of the present invention, an apparatus for manufacturing a substrate comprises a chamber. A process for baking a photoresist layer on the substrate is performed in the chamber. Means for heating the substrate includes a heater arranged in the chamber to provide heat in order to heat the substrate. A hot plate, on which the substrate is placed, is preferably made of a composite plate having a plurality of plates each having a different thermal conductivity. The substrate is heated using heat from the heater.

According to the foregoing principles of the present invention, because the hot plate provides a uniform temperature distribution, process failures resulting from the non-uniform temperature distribution of the hot plate can be reduced. In other words, layers formed on the substrate have a uniform thickness and a photoresist layer on the substrate can be more effectively removed. In addition, the photoresist layer baked by the hot plate will have a more uniform thickness. The reliability and productivity of a semiconductor device manufacturing apparatus, as well as the devices manufactured therein, are also improved.

BRIEF DESCRIPTION OF THE DRAWINGS

The above and other objects and advantages of the present invention will become readily apparent through the following detailed description of preferred embodiments made with reference to the accompanying drawings, wherein.

DETAILED DESCRIPTION OF PREFERRED EMBODIMENTS

Various embodiments of the present invention will now be described in detail with reference to the accompanying drawings.

Figure 1:
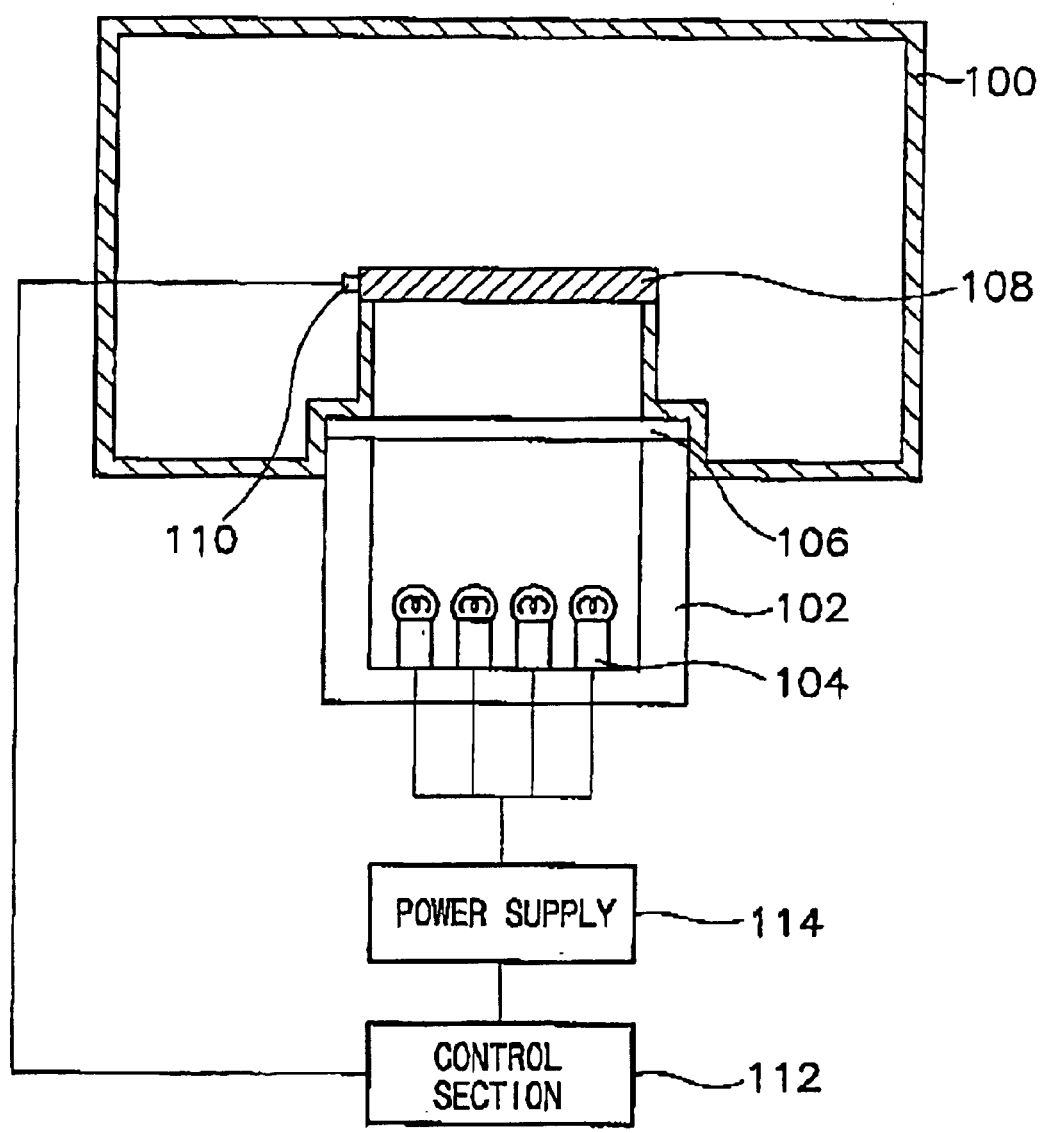
FIG. 1 is a schematic cross-sectional view of a conventional apparatus for heating a substrate.
Figure 2:
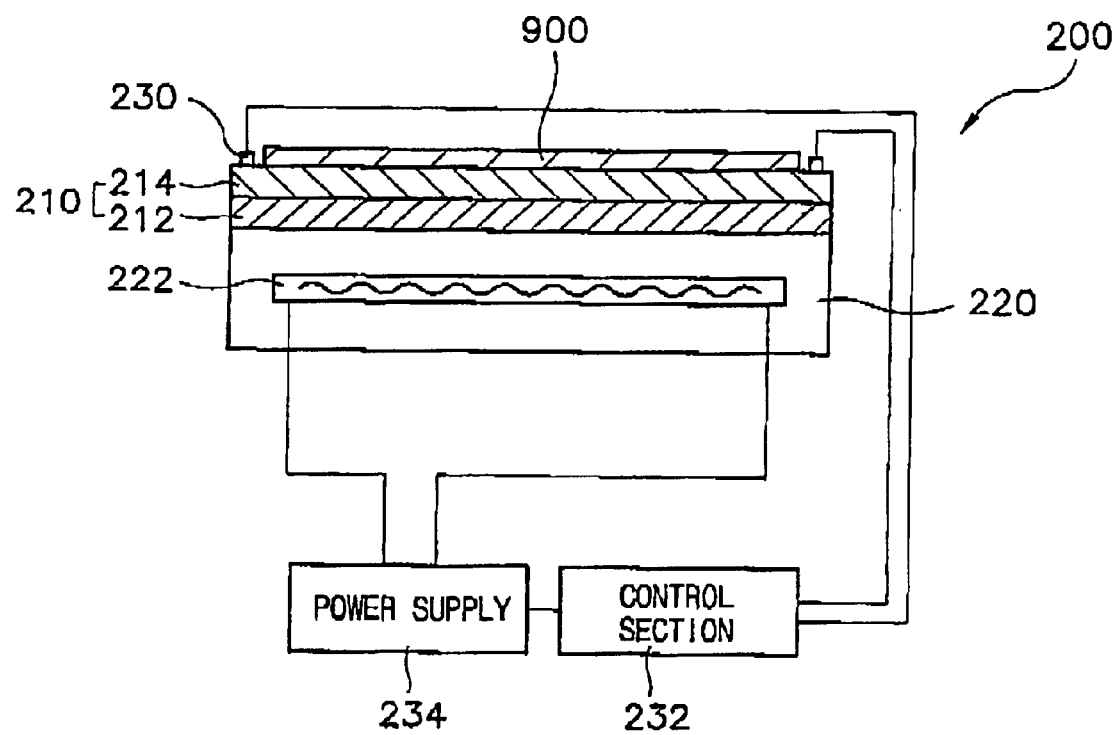
FIG. 2 is a schematic cross-sectional view of an apparatus for heating a substrate according to a first embodiment of the present invention.

FIG. 2 is a schematic cross-sectional view of an apparatus 200 for heating a substrate 900 according to a first embodiment of the present invention. Referring to FIG. 2, the apparatus 200 for heating the substrate 900 includes a hot plate 210 and a heater 220. The hot plate 210 includes disk-shaped first and second plates 212, 214. The first plate 212 and second plate 214 have different thermal conductivities from each other. The second plate 214 is attached (e.g., laminated) to an upper surface of the first plate 212. The substrate 900 is placed on the upper surface of the second plate 214. The heater 220 includes a hot wire 222 arranged within the heater 220. The heater 220 is attached to the lower surface of the hot plate 210. The hot wire 222 is heated by electric power, and the hot plate 210 is heated by receiving heat conducted from the heater 220.

The first plate 212, which is attached to the heater 220, is preferably made of a material that has a relatively high thermal conductivity, such as aluminum. The second plate 214, on which the substrate 900 is placed, is preferably made of a material that has a thermal conductivity lower than that of the first plate 212, such as stainless steel or titanium. The hot plate 210 is therefore formed having plate layers of different thermal conductivities.

The hot plate 210 of this embodiment is better able to maintain the temperature as well as a more uniform temperature distribution when compared with hot plates made of a single material. According to this embodiment, therefore, the substrate 900, placed on the second plate 214, can be uniformly heated. The hot plate 210 of this embodiment also reduces the amount of energy required to heat the substrate.

In addition, because the second plate 214, on which the substrate 900 is placed, is formed of a material such as stainless steel or titanium having a lower thermal conductivity, an amount of heat lost into a chamber used for fabricating the substrate 900 can be reduced. When the substrate 900 is heated via the second plate 214, thermal shock due to quick heating can also be minimized.

A plurality of sensors 230 are also preferably installed along a periphery of the second plate 214 to measure the temperature of the second plate 214 more accurately. A control section 232 is connected to the temperature sensors 230, and generates a control signal based on temperature measurement signals from the temperature sensors 230 to constantly maintain the temperature of the second plate 214. The control signal is transmitted to a power supply 234, and the power supply 234 provides the hot wire 222 with an appropriately adjusted amount of electric power using the control signal.

Figure 3:
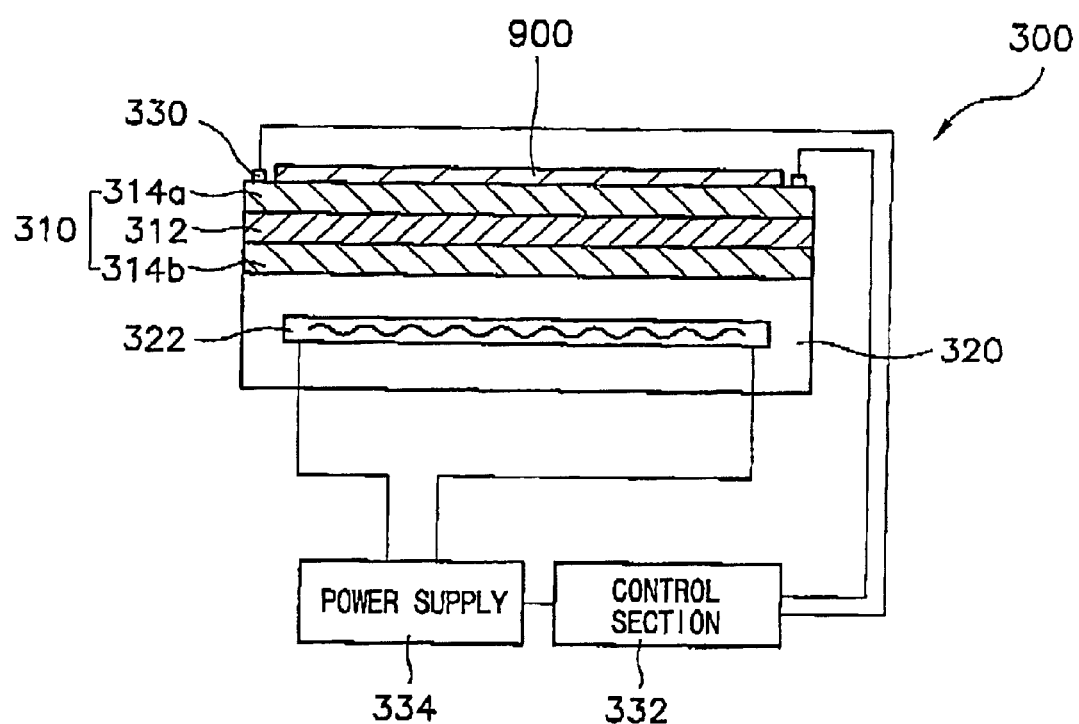
FIG. 3 is a schematic cross-sectional view of an apparatus for heating a substrate according to a second embodiment of the present invention.

FIG. 3 is a schematic cross-sectional view of an apparatus 300 for heating a substrate 900 according to a second embodiment of the present invention. Referring to FIG. 3, the apparatus 300 for heating the substrate 900 according to the second embodiment is nearly identical to the apparatus 200 for heating the substrate according to the first embodiment referred to FIG. 2, except with respect to the construction of a hot plate 310. A detailed description regarding identical components will therefore not be repeated. The hot plate 310 includes a first plate 312 and two second plates 314A, 314B. The second plates 314A, 314B are attached (e.g., laminated) to an upper surface and a lower surface of the first plate 312, respectively. The first plate 312 and the second plates 314A, 314B each have a disk shape. The first plate 312 is preferably made of aluminum, which has a relatively high thermal conductivity. The second plates 314A, 314B are preferably made of stainless steel or titanium, which has a thermal conductivity lower than aluminum. A heater 320, a hot wire 322, a temperature sensor 330, a control section 332 and a power supply 334 are also provided.

Generally, a three-layer composite plate is better able to maintain a constant temperature and a more uniform temperature distribution than both a two layer composite plate and a single material plate. Table 1 provides a chart listing the thermal conductivities of the materials used in the hot plates of FIGS. 2 and 3.

TABLE 1

| Hot Plate Materials | Thickness (mm) | Thermal conductivity (W/mK) | |
|---|---|---|---|
| | | Vertical direction against laminate | Horizontal direction against laminate |
| 304 stainless steel, Aluminum | 2 | 28 | 178 |
| 304 stainless steel, Aluminum, 304 stainless steel | 2 | 16 | 127 |
| Titanium, Aluminum | 1.6 | 38 | 177 |
| 304 stainless steel | | | 16 |
| Titanium | | | 17.2 |
| Aluminum alloy (3004) | | | 163 |
| Pure aluminum | | | 221 |
| Copper | | | 394 |

Referring to Table 1, a composite plate (2 or 3 layers) formed by laminating materials having different thermal conductivities together, has a lower thermal conductivity against a surface of the hot plate in a vertical direction than a hot plate made only of aluminum. The thermal conductivity of the composite plate is similar to that of the hot plate made of only aluminum, however, in a horizontal direction.

In the hot plate made of only aluminum, since the aluminum has a relatively high thermal conductivity, a large amount of heat energy is lost by radiation into the chamber when the substrate is not loaded on the hot plate. In addition, a non-uniform temperature distribution may be induced into each portion of the hot plate heated by the heater. In the composite hot plate formed from plates having different thermal conductivities, however, since a portion of the hot plate adjacent to the inner space of a chamber is made of stainless steel or titanium, the amount of heat energy lost by radiation can be reduced. In addition, a more uniform temperature distribution can be obtained due to a difference between the thermal conductivity in the vertical direction against the laminate and the thermal conductivity in the horizontal direction against the laminate.

Figure 4:
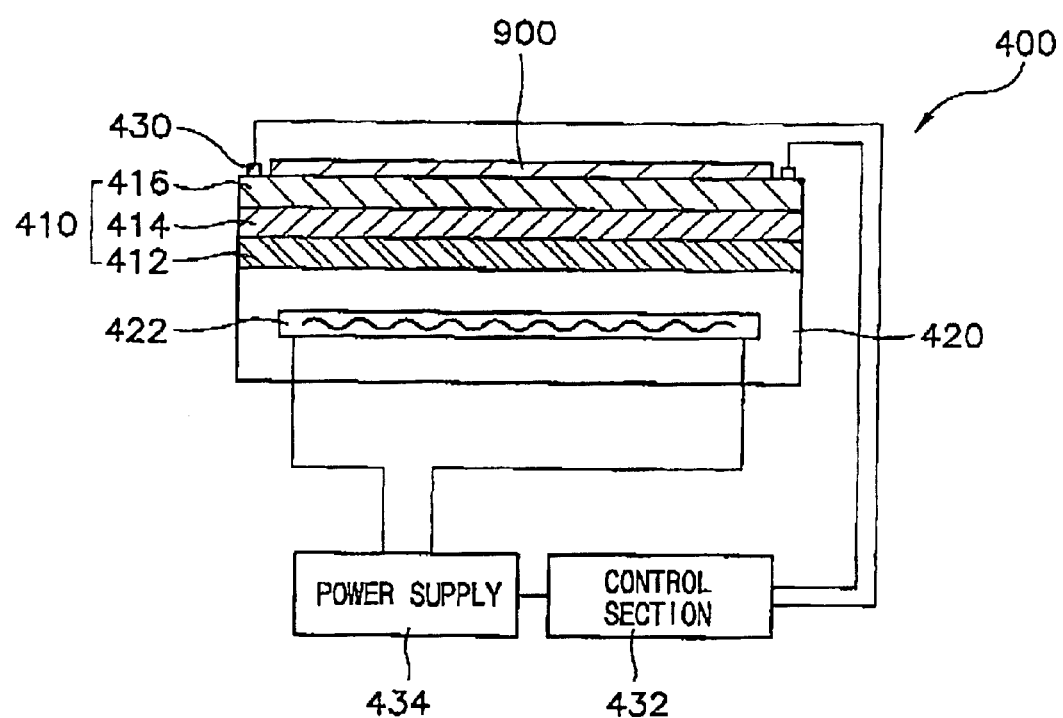
FIG. 4 is a schematic cross-sectional view of an apparatus for heating a substrate according to a third embodiment of the present invention.

FIG. 4 is a schematic cross-sectional view of an apparatus 400 for heating a substrate 900 according to a third embodiment of the present invention. The apparatus 400 for heating the substrate 900 according to the third embodiment has a similar structure to that of the apparatus 200 for heating the substrate according to the first embodiment referred to FIG. 2, except for the construction of a hot plate 410. Accordingly, repeated detailed descriptions regarding identical parts will be omitted.

Referring to FIG. 4, the hot plate 410 includes a first plate 412 heated by a heater 420. A second plate 414 is attached (e.g. laminated) to an upper surface of the first plate 412, and a third plate 416, on which the substrate 900 is placed, is attached to an upper surface of the second plate 414. The first plate 412 is preferably made of copper, which has a relatively high thermal conductivity. The second plate 414 is preferably made of aluminum, which has a lower thermal conductivity than that of copper. The third plate 416 is preferably made of stainless steel or titanium, each of which has a lower thermal conductivity than that of aluminum. A temperature sensor 430 is installed on the periphery of the third plate 416 to measure the temperature of the hot plate 410. A hot wire 422, a control section 432, and a power supply 434 are also provided.

Figure 5:
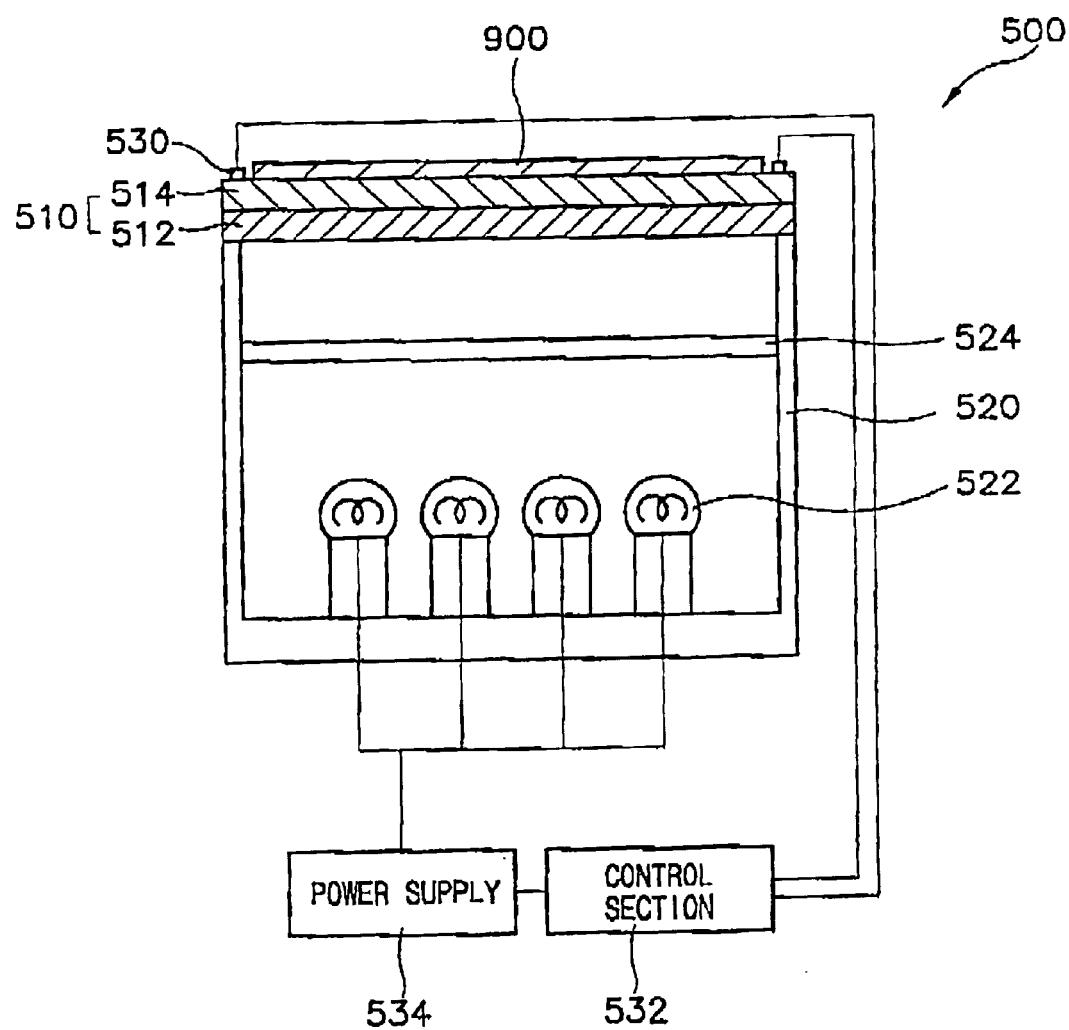
FIG. 5 is a schematic cross-sectional view of an apparatus for heating a substrate according to a fourth embodiment of the present invention.

FIG. 5 is a schematic cross-sectional view illustrating an apparatus 500 for heating a substrate 900 according to a fourth embodiment of the present invention. Referring to FIG. 5, the apparatus 500 for heating the substrate 900 according to this embodiment is lamp-heated. A hot plate 510 of the apparatus 500 for heating the substrate 900 can have a two layer-structure having a first plate 512 and a second plate 514 identical to that of the hot plate 210 of the first embodiment (shown in FIG. 2). The three-layer hot plate 310 of the second embodiment (shown in FIG. 3) or the hot plate 410 of the third embodiment (shown in FIG. 4) could also be used.

A lamp housing 520 is connected to a periphery of a lower surface of the hot plate 510. A tungsten lamp 522, for heating the substrate 900, is installed inside the lamp housing 520. A quartz plate 524 is installed in a center portion of the lamp housing 520 between the hot plate 510 and the tungsten lamp 522. Light radiated from the tungsten lamp 522 heats the hot plate 510 through the quartz plate 524. The apparatus 500 for heating the substrate 900 also includes a temperature sensor 530 for measuring a temperature of the hot plate 510, a control section 532 for generating a control signal in order to adjust a radiation degree of the tungsten lamp 522 based on a temperature signal provided from the temperature sensor 530, and a power supply 534 for providing the tungsten lamp 522 with electric power.

Figure 6:
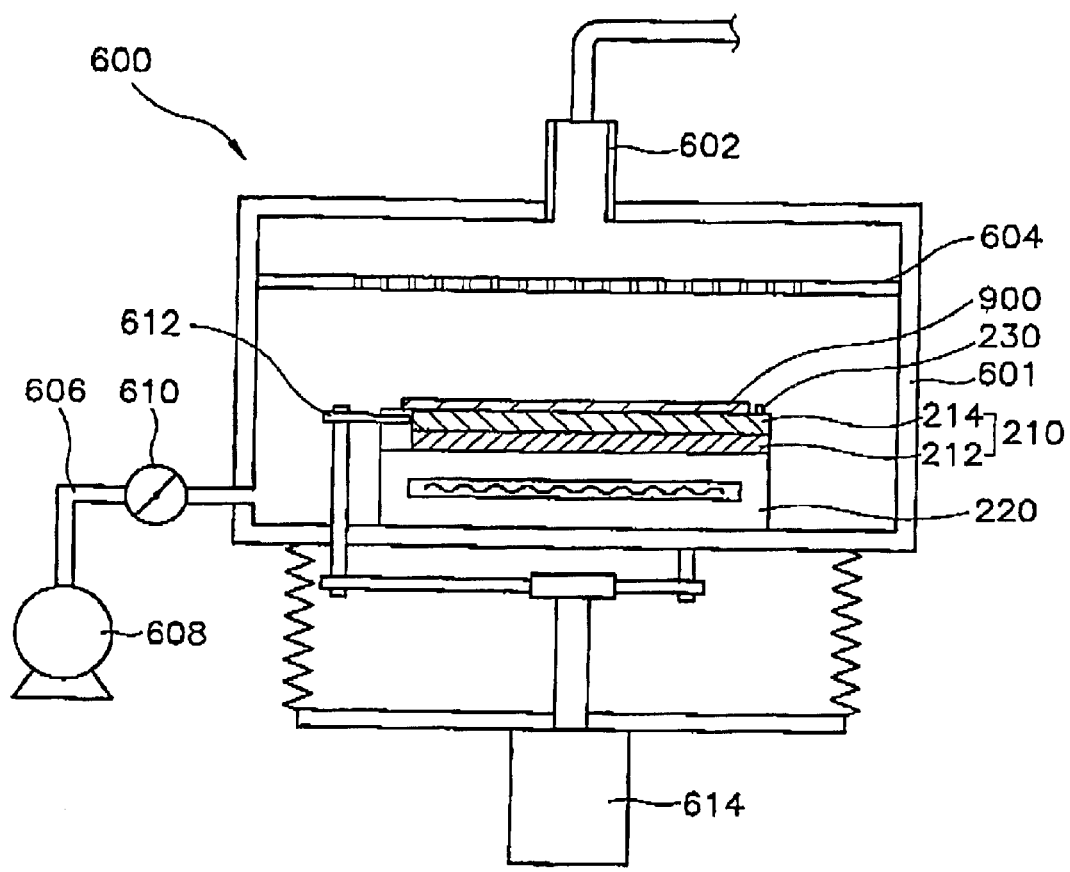
FIG. 6 is a schematic cross-sectional view of an process apparatus including the heating apparatus shown in FIG. 2.

FIG. 6 is a schematic cross-sectional view of an apparatus 600 for processing a substrate having the heating apparatus 200 shown in FIG. 2. Referring to FIG. 6, the process apparatus 600 includes a process chamber 601 for manufacturing the substrate 900 includes the hot plate 210, on which the substrate 900 is placed, and the heater 220 for heating the substrate 900. The heater 220 is attached to the lower surface of the hot plate 210.

A gas supplying part 602 is installed on the upper portion of the chamber 601 for providing the chamber 601 with a gas used to manufacture the substrate 900. A baffle plate 604 is provided between the gas supplying part 602 and the hot plate 210 to uniformly provide the chamber 601 with the gas. A gas exhausting line 606 and a vacuum pump 608 are connected to a side portion of the chamber 601 for exhausting a reaction by-product and a non-reacted gas from the chamber 601. A valve 610 is installed in the gas exhausting line 606 for adjusting a degree of the vacuum state in the chamber 601. A lifter 612 is provided on a side of the hot plate 210 for loading the substrate 900 on the hot plate 210 and for unloading the substrate 900 from the hot plate 210. A driving section 614 connected to a lower portion of the chamber 601 operates the lifter 612.

The hot plate 210 includes a first plate 212 attached to the upper surface of the heater 220 and a second plate 214, on which the substrate 900 is placed. The second plate 214 is attached (e.g., laminated) to the upper surface of the first plate 212. The first plate 212 is preferably made of aluminum, which has a relatively high thermal conductivity. The second plate 214 is preferably made of stainless steel or titanium, which both have a lower thermal conductivity than aluminum.

After silane ($SiH_4$) gas and oxygen ($O_2$) gas are provided to the chamber 601 through the gas supply 602, the silane gas and oxygen gas are converted to a plasma state, and an oxide layer is formed on the substrate 900. Process conditions including pressure, temperature, and working time determine a thickness of the oxide layer. When a substrate 900 having a photoresist layer is placed on the hot plate 210, however, oxygen gas supplied to the chamber 601 and converted to a plasma state removes the photoresist layer.

Temperature sensors 230, installed along the periphery of the hot plate 210, measure the temperature of the hot plate 210. A control section 232 (see FIG. 2) uses the temperature signals from the temperature sensors 230 to generate a control signal to constantly maintain the temperature of the hot plate 210.

By heating the substrate using a hot plate comprising a composite plate having laminated plate layers of different thermal conductivities, the substrate can be uniformly heated, and the amount of energy required to keep the hot plate at a constant temperature can be reduced. In addition, the thickness of a layer formed on the substrate can be made more uniform and a photoresist layer can be more stably removed from the substrate.

Figure 7:
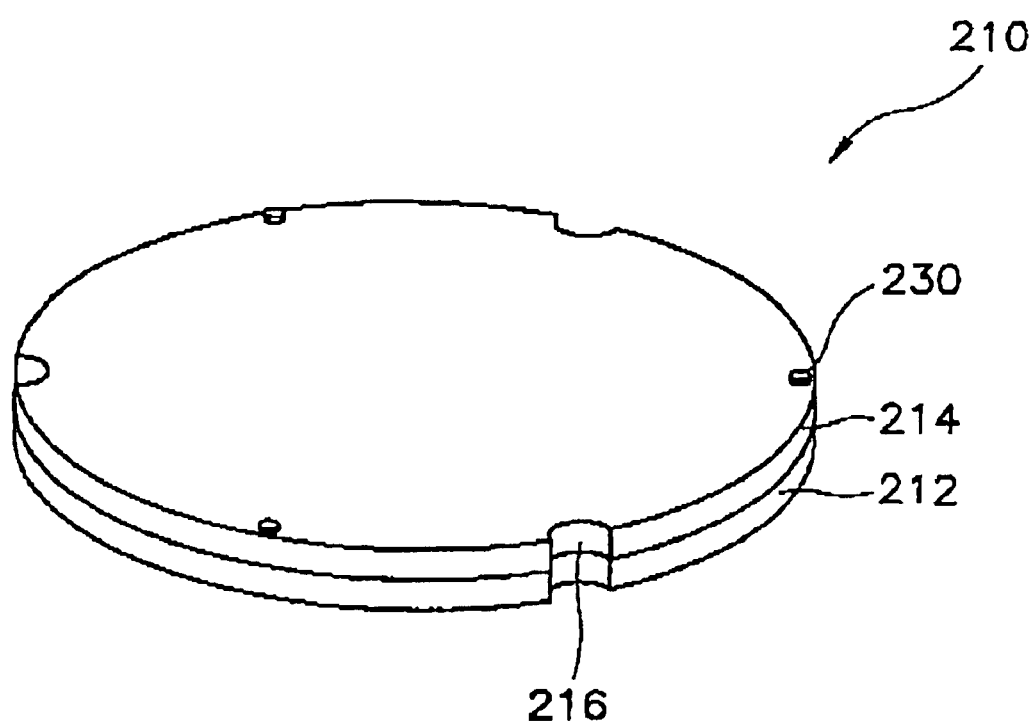
FIG. 7 is a perspective view of the heating apparatus shown in FIG. 6.

FIG. 7 is perspective view of the hot plate 210 shown in FIGS. 2 and 6. Referring to FIGS. 2, 6, and 7, the hot plate 210 includes a first plate 212 arranged on an upper surface of a heater 220. A second plate 214, on which the substrate 900 is placed, is attached (e.g., laminated) to an upper surface of the first plate 212. A plurality of temperature sensors 230 are installed along the periphery of the upper surface of the hot plate 210 to measure the hot plate 210 temperature. In addition, a plurality of grooves 216 are formed along a side portion of the hot plate 210 to receive the lifter 612 for loading and unloading the substrate.

Figure 8:
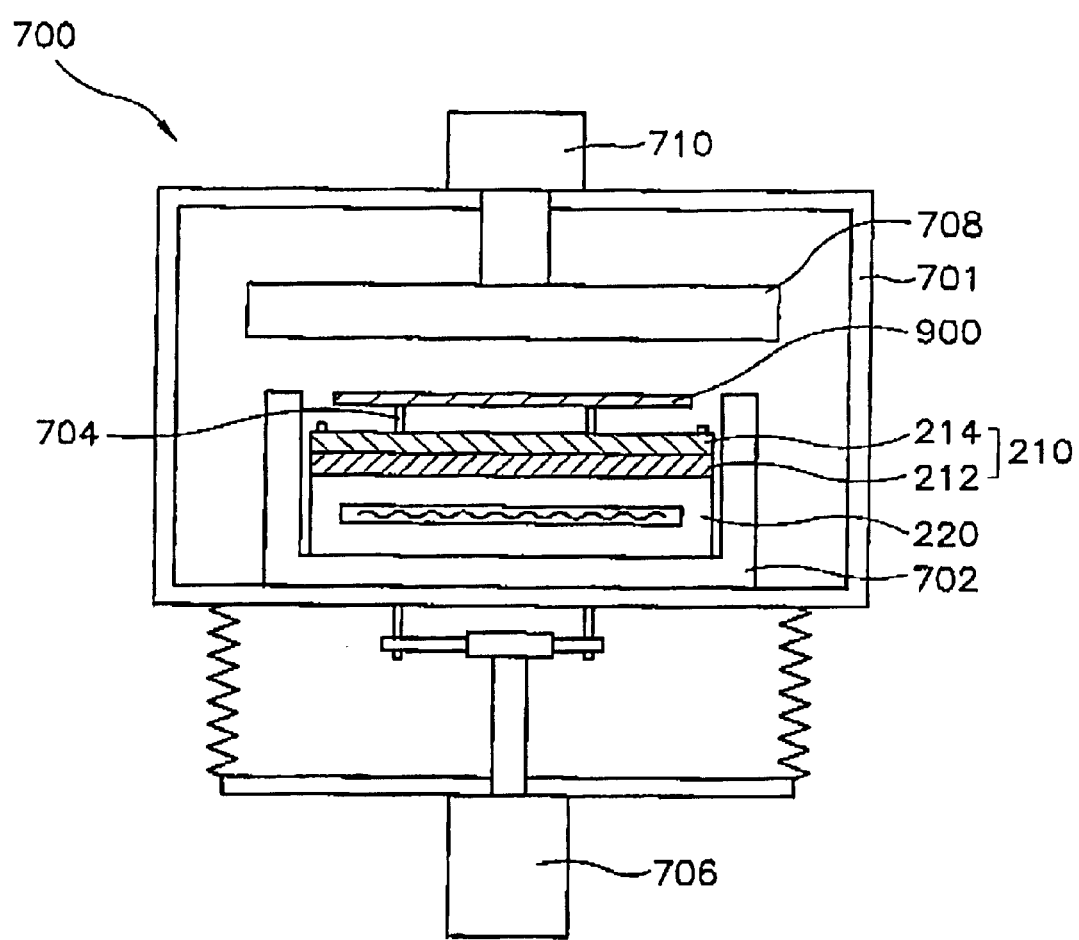
FIG. 8 is a schematic cross-sectional view of a process apparatus having the heating apparatus shown in FIG. 2 according to another embodiment.

FIG. 8 is a schematic cross-sectional view illustrating another example of an apparatus 700 (e.g., including a process chamber) that includes the heating apparatus 200 shown in FIG. 2. Referring to FIG. 8, an apparatus 200 for heating a substrate 900 is employed in an apparatus 700 for baking a photoresist layer coated on the substrate 900. A hot plate 210 is provided in a chamber 701 and a heater 220 is attached to a lower surface of the hot plate 210.

The hot plate 210 preferably includes a composite plate having a first plate 212 and the second plate 214 with different thermal conductivities laminated to each other. The first plate 212 is preferably made of aluminum and the second plate 214 is preferably made of stainless steel or titanium. The first plate 212 can be installed on the heater 220 while the second plate 214 has the substrate 900 arranged thereon.

The hot plate 210 and the heater 220 are preferably installed on a panel 702 disposed on a top surface of the bottom of the chamber 701. A cavity is formed on an upper surface of the panel 702 to receive the hot plate 210 and the heater 220. A first driving section 706 drives a plurality of lift pins 704 in order to load or unload the substrate 900. The first driving section 706 is connected to a lower surface of the chamber 701. The lift pins 704 are installed through openings in the hot plate 210, the heater 220, and the panel 702.

A cover 708 is provided in an upper portion of the inner space of the chamber 701. During a baking process, the cover 708 is placed in close proximity to an upper edge portion of the panel 702 to isolate the substrate 900 from the inner space of the chamber 701. The cover 708 can preferably be moved up and down by a second driving section 710, which is connected to an upper portion of the chamber 701. According to this embodiment, the substrate 900 being heated by the composite hot plate 210 can be uniformly heated. It is therefore possible to form a photoresist layer having a uniform thickness.

As described above, according to principles of the present invention, a composite hot plate comprising a plurality of plates having different thermal conductivities can be used to uniformly heat a substrate. The composite hot plate is better able to maintain both a constant temperature and a uniform temperature distribution.

An apparatus for heating the substrate which includes a composite hot plate is better able to uniformly heat a substrate while reducing the amount of energy required for heating the substrate. In addition, this apparatus can stably perform a plurality of processes even when the substrate is heated at a high temperature. For example, it is possible to form a layer having a uniform thickness on the substrate in film deposition process, to stably remove a photoresist layer formed on the substrate in an ashing process, and to form a photoresist layer having a uniform thickness in baking process. Furthermore, in this manner, the reliability and productivity of a semiconductor device manufactured by the apparatus can be improved.

While the present invention has been described in detail with reference to various preferred embodiments thereof, it should be understood by those skilled in the art that various changes, substitutions, and alterations can be made hereto without departing from the scope of the invention as defined by the appended claims.

What is claimed is:

1. An apparatus for heating a substrate comprising:
   a heater for generating heat to heat the substrate; and
   a hot plate for supporting the substrate, said hot plate arranged above the heater and comprising a plurality of plates including an upper plate for supporting the substrate, wherein each of the plates has a different thermal conductivity from at least one of the other plates, wherein a lower plate has a thermal conductivity higher than the upper plate, and wherein the substrate is heated by transferring heat from the heater to the substrate through the plurality of plates of the hot plate.

2. The apparatus according to claim 1, wherein the hot plate comprises:
   a first plate comprising a material having a first thermal conductivity; and
   a second plate comprising a material having a second thermal conductivity lower than the first thermal conductivity, wherein the second plate is arranged on an upper surface of the first plate to support the substrate.

3. The apparatus according to claim 2, wherein the first plate comprises aluminum and wherein the second plate comprises stainless steel or titanium.

4. The apparatus according to claim 1, wherein the hot plate comprises:
   a first plate made from a material having a first thermal conductivity;
   a second plate made from a material having a second thermal conductivity, said second plate being disposed on an upper surface of the first plate; and
   a third plate made from a material having a third thermal conductivity, said third plate being arranged on an lower surface of the first plate.

5. The apparatus according to claim 4, wherein the second thermal conductivity is lower than the first thermal conductivity and wherein the third thermal conductivity is approximately equal to the second thermal conductivity.

6. The apparatus according to claim 5, wherein the first plate is made of aluminum and wherein the second and third plates are made of stainless steel or titanium.

7. The apparatus according to claim 1, wherein the hot plate comprises:
   a first plate having a first thermal conductivity;
   a second plate disposed on an upper surface of the first plate, said second plate having a second thermal conductivity that is lower than the first thermal conductivity; and
   a third plate arranged on an upper surface of the second plate, said third plate having a third thermal conductivity that is lower than the second thermal conductivity.

8. The apparatus according to claim 7, wherein the first plate comprises copper, the second plate comprises aluminum, and the third plate comprises stainless steel or titanium.

9. The apparatus according to claim 1, wherein the heater includes a hot wire for generating heat using electric power.

10. The apparatus according to claim 9, wherein the hot plate is arranged on an upper surface of the heater and is heated by heat conducted from the heater.

11. The apparatus according to claim 1, wherein the heater includes a lamp.

12. The apparatus according to claim 11, wherein the hot plate is arranged over the heater and is heated by light radiated from the lamp.

13. The apparatus according to claim 1, further comprising:
   a sensor installed on an edge portion of an upper surface of the hot plate to sense a temperature of the hot plate; and
   a controller, connected to the sensor, for controlling the temperature of the hot plate using a temperature signal from the sensor.

14. The apparatus according to claim 13, wherein the sensor comprises a plurality of sensors installed along a peripheral portion of the hot plate.

15. An apparatus for manufacturing a substrate comprising:
   a chamber for performing a manufacturing process on the substrate;
   a gas supplying part to provide a gas to the chamber; and
   means for heating the substrate, said means for heating comprising a heater and a hot plate, wherein said hot plate comprises a plurality of plates having two or more different thermal conductivities, wherein a lower plate has a thermal conductivity higher than an upper plate, and wherein the heater is arranged beneath the hot plate to transfer heat to the substrate through the plurality of plates.

16. The apparatus according to claim 15, wherein the chamber performs a process to remove a photoresist layer formed on the substrate using a plasma.

17. The apparatus according to claim 15, wherein the chamber performs a process to form a layer on the substrate using a plasma.

18. An apparatus for manufacturing a substrate comprising:
   a chamber for performing a substrate manufacturing process;
   a heater arranged in the chamber to heat the substrate; and
   a hot plate comprising a plurality of plates, wherein each of the plates has a thermal conductivity that is different from at least one of the other plates and a lower plate has a thermal conductivity higher than an upper plate, wherein the heater is arranged beneath the hot plate, and the substrate is heated using heat provided from the heater through the hot plate.

19. The apparatus according to claim 18, wherein the substrate manufacturing process comprises baking a photoresist layer coated on the substrate.

* * * * *